(12) United States Patent
Huang

(10) Patent No.: US 7,576,561 B1
(45) Date of Patent: Aug. 18, 2009

(54) DEVICE AND METHOD OF CONFIGURING A DEVICE HAVING PROGRAMMABLE LOGIC

(75) Inventor: Jinsong Huang, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 11/985,174

(22) Filed: Nov. 13, 2007

(51) Int. Cl.
*H03K 7/38* (2006.01)

(52) U.S. Cl. ............... 326/38; 326/40; 326/39; 365/228

(58) Field of Classification Search ............... 326/38–41
See application file for complete search history.

(56) References Cited

U.S. PATENT DOCUMENTS

| | | | |
|---|---|---|---|
| 4,940,909 A | 7/1990 | Mulder et al. | |
| 5,343,406 A | 8/1994 | Freeman et al. | |
| 5,426,378 A | 6/1995 | Ong | |
| 5,789,938 A * | 8/1998 | Erickson et al. | 326/40 |
| 5,883,525 A | 3/1999 | Tavana et al. | |
| 6,102,963 A * | 8/2000 | Agrawal | 716/17 |
| RE37,195 E | 5/2001 | Kean | |
| 6,337,579 B1 | 1/2002 | Mochida | |
| 6,518,787 B1 | 2/2003 | Allegrucci et al. | |
| 6,538,468 B1 * | 3/2003 | Moore | 326/40 |
| 6,774,672 B1 | 8/2004 | Lien et al. | |
| 6,851,047 B1 | 2/2005 | Fox et al. | |
| 7,091,745 B1 | 8/2006 | Jacobson | |
| 7,111,224 B1 | 9/2006 | Trimberger | |
| 7,154,297 B1 * | 12/2006 | Camarota et al. | 326/40 |
| 7,242,218 B2 * | 7/2007 | Camarota et al. | 326/41 |
| 7,301,822 B1 * | 11/2007 | Walstrum et al. | 365/189.011 |
| 7,358,762 B1 * | 4/2008 | Walstrum et al. | 326/38 |
| 7,425,843 B1 * | 9/2008 | Edwards et al. | 326/38 |
| 7,459,931 B1 * | 12/2008 | Tang et al. | 326/38 |
| 2006/0119384 A1 * | 6/2006 | Camarota et al. | 326/38 |

OTHER PUBLICATIONS

Xilinx, Inc., "Spartan and Spartan-XL Families Filed Programmable Gate Arrays", DS060 (v1.7) Jun. 27, 2002, pp. 1-82, available from Xilinx, Inc., 2100 Logic Drive, San Jose, California 95124.

(Continued)

*Primary Examiner*—Vibol Tan
(74) *Attorney, Agent, or Firm*—John J. King

(57) ABSTRACT

A method of configuring a device having programmable logic is disclosed. The method comprises storing instructions in the device; selecting between one of the instructions stored in the device and an instruction coupled to an input/output port of the device; coupling the instruction to a non-volatile memory; and reading a configuration bitstream from the non-volatile memory based upon the selected instruction. A method of enabling a multi-boot configuration of a device having programmable logic is disclosed. The method comprises powering up the device using a first configuration bitstream from a first type of configuration device in response to a first command; receiving a reboot command; and reconfiguring the device using a second configuration bitstream from a second type of configuration device in response to a second command which is different than the first command. Circuits enabling a multi-boot configuration of a device having programmable logic are also disclosed.

40 Claims, 6 Drawing Sheets

OTHER PUBLICATIONS

Xilinx, Inc., "Spartan-3 FGPA Family: Function Description", DS099-2 (v1.3), Aug. 24, 2004, pp. 1-40, available from Xilinx, Inc., 2100 Logic Drive, San Jose, California 95124.

U.S. Appl. No. 11/131,764, filed May 18, 2005, James A. Walstrum Jr., Parallel Interface For Configuring Programmable Devices, Xilinx, Inc., 2100 Logic Drive, San Jose, California 95124.

U.S. Appl. No. 11/131,751, filed May 18, 2005, James A. Walstrum Jr., "Multi-Boot Configuration of Programmable Devices", Xilinx, Inc., 2100 Logic Drive, San Jose, California 95124.

Spartan-3 Configuration User Guide (UG332 (v1.0) Dec. 5, 2006, pp. 238-239, Xilinx, Inc., 2100 Logic Drive, San Jose, California 95124.

* cited by examiner

DEVICE AND METHOD OF CONFIGURING A DEVICE HAVING PROGRAMMABLE LOGIC

FIELD OF THE INVENTION

The present invention relates generally to integrated circuits, and in particular, to a device having programmable logic and a method of configuring a device having programmable logic.

BACKGROUND OF THE INVENTION

For an integrated circuit to function properly, it is necessary that data be loaded into memory elements. One type of integrated circuit which relies on data loaded into memory elements is a programmable logic device (PLD). A PLD is designed to be user-programmable so that users may implement logic designs of their choice. Programmable logic circuits of a PLD comprise gates which are configurable by a user of the circuit to implement a specific circuit design. One type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. In some CPLDs, configuration data is stored on-chip in non-volatile memory, then downloaded to volatile memory as part of an initial configuration sequence.

Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose.

PLDs also have different "modes" depending on the operations being performed on them. A specific protocol allows a programmable logic device to enter into the appropriate mode. Typical PLDs have internal blocks of configuration memory which specify how each of the programmable cells will emulate the user's logic. During a "program" mode, a configuration bitstream is provided to non-volatile memory, such as a read-only memory (ROM) (e.g., a programmable ROM (PROM), an erasable PROM (EPROM), or an electrically erasable PROM (EEPROM)) either external or internal to the programmable logic device. Each address is typically accessed by specifying its row and column addresses. During system power up of a "startup" mode, the configuration bits are successively loaded from the non-volatile memory into static random access memory (SRAM) configuration latches of a configuration logic block.

Programmable logic devices may also enable multi-boot, or the ability to dynamically reconfigure from multiple design revisions, to allow a user to dynamically switch between different revisions stored in the non-volatile memories. Conventional programmable logic devices allow receiving configuration bitstreams from any of a number of non-volatile memory devices. Although there are many vendors from which to choose, leading to a wider variety of memory densities and types, and more importantly, lower cost and better availability, such a variety of devices has made interfacing with the devices more difficult. Although all vendors' devices generally support similar instructions, they may use different instruction bits for those instructions. That is, they may use different instruction bits to implement the same commands. For example, one SPI Flash vendor may use an 8-bit instruction 00001011 for a read command, while another vendor may use a the bits 11101000 for the same read command. While conventional FPGA devices use variant select pins VS[2:0] to select a predefined 8-bit instruction, the 3-bit variant select command may only be used to select one of eight instructions. With the greater availability of programming devices, such an arrangement for selecting an instruction for accessing data from a memory is unduly restrictive. Further, the greater availability of programming devices also makes multi-boot reconfiguration more difficult.

Accordingly, there is a need for an improved device having programmable logic and method of configuring a device having programmable logic.

SUMMARY OF THE INVENTION

A method of configuring a device having programmable logic is disclosed. The method comprises storing a plurality of instructions in the device; selecting between one of the plurality of instructions stored in the device and an instruction coupled to an input/output port of the device; coupling the selected instruction to a command decoder; and reading a configuration bitstream from a non-volatile memory based upon the selected instruction. The method may further comprise coupling a command selection signal to the multiplexer by way of input/output ports of the device. Further, reading a configuration bitstream from the non-volatile memory may comprise reading from a non-volatile memory of a plurality of non-volatile memories.

According to an alternate embodiment, a method of configuring a device having programmable logic comprises storing a plurality of instructions in the device; receiving an instruction serially by way of an input/output port; storing the instruction received from the input/output port in a memory of the device; selecting between one of the plurality of stored instructions and the instruction received by way of the input/output port; and coupling the selected instruction to a non-volatile memory. Storing a plurality of instructions may comprise storing a plurality of instructions in shift registers. The method may further comprise reading a configuration bitstream from the non-volatile memory based upon the selected instruction, and programming the programmable logic using the configuration bitstream.

A device having programmable logic is also disclosed. The device comprises a plurality of memory locations storing a plurality of instructions; an input/output port coupled to receive an instruction; a configuration controller comprising a selection circuit coupled to the plurality of memory locations and the input/output port, the selection circuit selecting an instruction from one of the plurality of memory locations or the input/output port; and a plurality of programmable logic circuits coupled to receive a configuration bits of a configuration bitstream based upon the selected instruction. The device may further comprise a memory location coupled to the input/output port, wherein the plurality of memory locations and the memory location coupled to the input/output port comprise a plurality of shift registers.

A method of enabling a multi-boot configuration of a device having programmable logic is disclosed. The method comprises powering up the device using a first configuration bitstream from a first configuration device comprising a first type of device in response to a first command; receiving a reboot command; and reconfiguring the device using a second configuration bitstream from a second configuration device comprising a second type of device in response to a second command which is different than the first command. The method may further comprise selecting a mode for receiving the first configuration bitstream from the first configuration device and selecting a mode for receiving the second configuration bitstream from the second configuration device. Selecting a mode for receiving the second configuration bitstream may comprise using a mode setting from the first configuration bitstream.

According to an alternate embodiment, a method of enabling a multi-boot configuration of a device having programmable logic comprises powering up the device using a configuration bitstream from a first configuration device comprising a first type of device; receiving a reboot command; selecting a mode for reconfiguring the programmable logic in response to a mode select value; selecting a second configuration device comprising a second type of device for providing a second configuration bitstream; and reconfiguring the programmable logic using the second configuration bitstream from the second configuration device. The method may further comprise coupling a programming command to a selected second configuration device by way of an input/output port of the device, wherein coupling a programming command comprises generating a programming command based upon a value stored in a memory of the device or based upon a value received by way of an input/output port.

A circuit enabling a multi-boot configuration of a device having programmable logic is also disclosed. The circuit comprises a programmable logic circuit configured according to a first configuration bitstream stored in a first configuration device comprising a first type of device; a selection circuit coupled to receive a selection signal; and a command decoder coupled to receive the output of the selection circuit, the command controller generating a programming command for the configuration device, wherein the programming command enables reconfiguring the programmable logic circuit according to a second configuration bitstream from a second configuration device of a second type of device which is different than the first type of device. The selection circuit may comprise a selection circuit from the group consisting of a selection circuit for selecting a mode select value, a selection signal for selecting a variant select value, and a selection circuit for selecting an instruction for the command decoder.

DETAILED DESCRIPTION OF THE DRAWINGS

Figure 1:
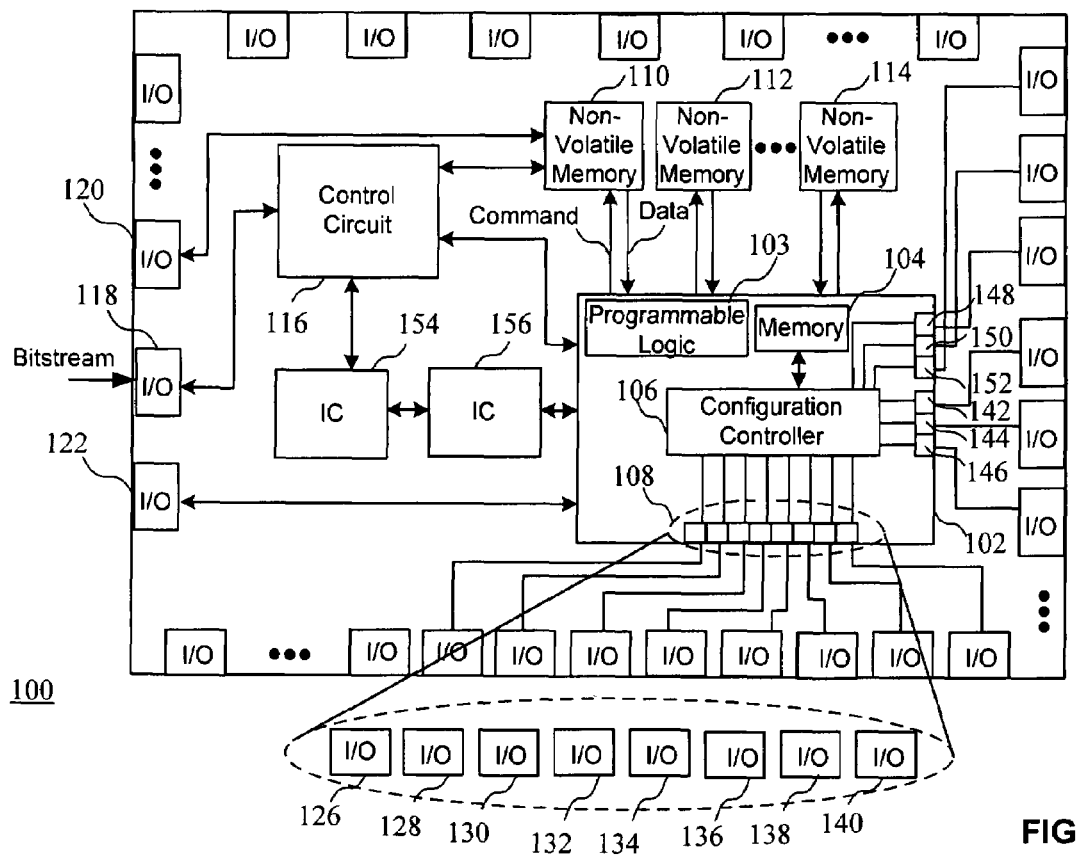
FIG. 1 is a block diagram of a system comprising a device having programmable logic according to an embodiment the present invention.

Turning first to FIG. 1, a block diagram of a system enabling multi-boot configuration in a device having programmable logic according to an embodiment of the present invention is shown. In particular, the system 100 comprises a device 102 having programmable logic 103 and a memory 104 coupled to a configuration controller 106 internal to the device. The configuration controller is also coupled to a plurality of input/output (I/O) pins 108 and a plurality of non-volatile memory devices 110-114 by way of input/output ports. The non-volatile memory devices may comprises Flash memory devices or any other type of configuration device. The non-volatile memory may comprise different types of non-volatile memory storing different configuration bitstreams for programming the programmable logic 103 of the device. That is, the configuration bits of the configuration bitstream are used to load configuration memory elements of the device to enable the device to function according to a user's design. A control circuit 116 is coupled to an I/O port 118 to receive a configuration bitstream. Other I/O ports, such as I/O port 120 coupled to the non-volatile memory 110 or I/O port 122 coupled to the device 102, enable access to other components of the system. I/O ports 126-140 of the device enable the communication of a programming command to the configuration controller, as will be described in more detail below. I/O ports 142-146 also enable communication of a 3-bit variant select value to the configuration controller, while I/O ports 148-152 enable communication of a mode select value to the configuration controller. Finally, other integrated circuits (ICs) 154 and 156 are integrated in the system to enable the system to function as designed. For example, the system 100 may comprise a circuit board having a plurality of integrated circuits including separate non-volatile memory devices.

Figure 2:
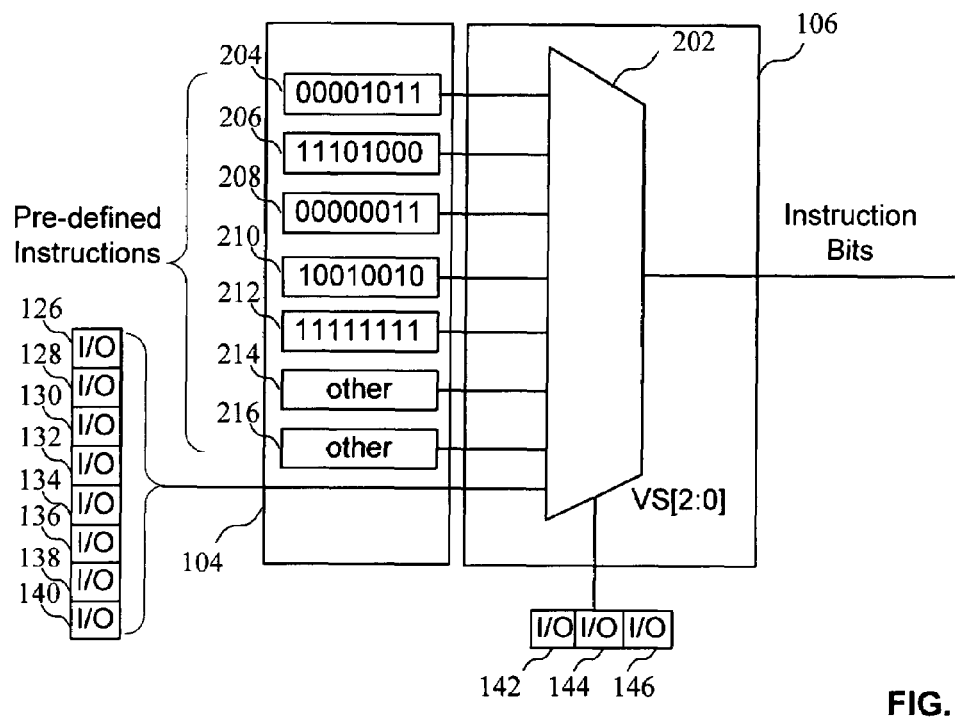
FIG. 2 is a block diagram of a portion of a configuration controller according to an embodiment of the present invention.

Turning now to FIG. 2, a block diagram of a portion of a configuration controller enabling multi-boot reconfiguration according to an embodiment of the present invention is shown. According to the configuration controller 106 of FIG. 2, a multiplexer 202 is coupled to receive a plurality of inputs and output a selected input. The plurality of inputs comprise pre-defined programming instructions which may comprise different instruction bits stored in a plurality of memories 204-216. A separate input is also coupled to receive data from I/O ports 126-140. A selection signal, shown here as a 3-bit selection signal VS[2:0], enables the selection of the instruction bits of one of the pre-defined instructions 204-216 or the input coupled to one or more I/O ports 126-140. The instructions may be used to generate a serial peripheral interface command for an SPI device, or a command for a parallel Flash device, for example.

Figure 3:
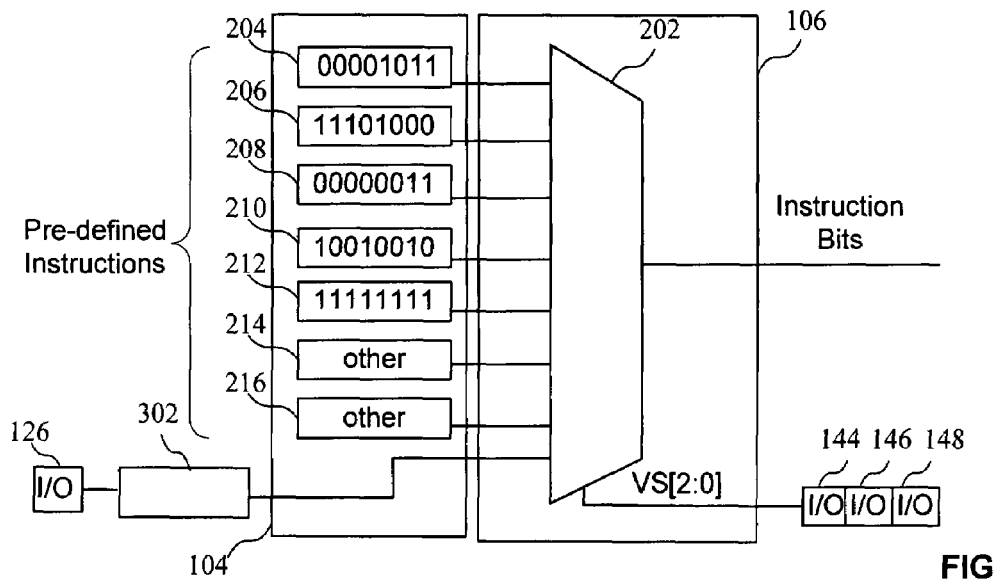
FIG. 3 is a block diagram of a portion of a configuration controller according to an alternate embodiment of the present invention.
Figure 4:
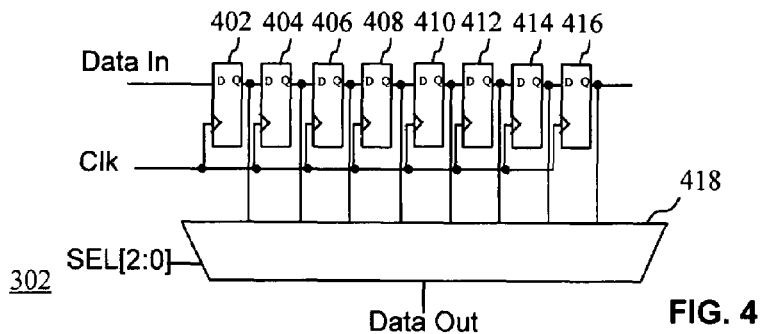
FIG. 4 is a block diagram of a shift register implemented with a configuration controller according to an embodiment of the present invention.

Turning now to FIG. 3, a block diagram of a portion of a configuration controller enabling multi-boot reconfiguration according to an alternate embodiment of the present invention is shown. According to the embodiment of FIG. 3, rather than receiving the 8 instruction bits by way of eight I/O ports or an I/O port comprising eight pins, a register 302 is coupled to a single I/O port to serially receive the 8 bits of the 8-bit instruction. The register 302, as well as the registers 204-216 may comprise a shift register, as shown in FIG. 4. In particular, a block diagram of a shift register implemented with a configuration controller according to an embodiment of the present invention is shown in FIG. 4. The shift register of FIG. 4 comprises eight registers 402-416 coupled to serially receive the input data DI. The output of each of the registers is coupled to a multiplexer 418, the output of which is selected based upon a 3-bit input signal SEL[2:0]. Alternatively, the variant select values may be coupled to the multiplexer 202 by way of internal memory elements of the device, as will be described in the reference to FIG. 5.

Figure 5:
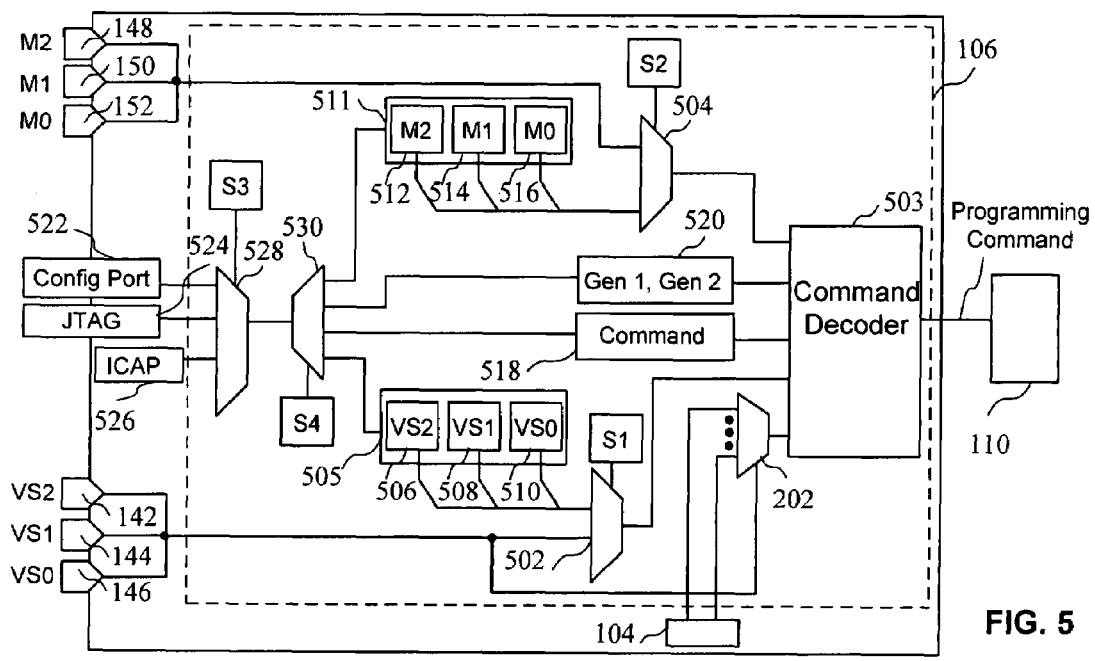
FIG. 5 is a block diagram of an input selection circuit for inputting signals to a configuration controller according to an embodiment of the present invention.

Turning now to FIG. 5, a block diagram of an input selection circuit for inputting signals to a configuration controller according to an embodiment of the present invention is shown. According to the embodiment of FIG. 5, the configuration controller 106 is coupled to a first multiplexer 502 and a second multiplexer 504 for selecting between various mode select values and variant select values, either stored on the device or in an external memory. In particular, a mode select value selects a mode for providing configuration data to the programmable logic device, such as a serial mode or a parallel mode, while the variant select values select an instruction to generate the appropriate programming command, such as a read command, for a given non-volatile memory. The pair of multiplexers 502 and 504 are each coupled to provide one of the various inputs to the command decoder 503. The command decoder also receives the instruction bits from the multiplexer 202 as described above in reference to FIGS. 2 and 3. Multiplexer 502 is coupled to select a 3-bit variant select value stored in a memory 505 comprising memory elements 506-510 at a first input or by way of the variant select inputs 142-146 at a second input. The variant select inputs 142-146 may be any general purpose I/O pins which may also be used for other functions after configuration. The multiplexer 504 is coupled to receive a 3-bit mode select value stored in a memory 511 comprising memory elements 512-516 at a first input or by way of the mode select inputs 148-152 at a second input. Similarly, the mode select inputs 148-152 may also be any general purpose I/O pins which may also be used for other functions. Selection signals, which may be a value stored in a memory S1 and S2, may select either stored values of the mode select values and variant select values, or mode select values and variant select values coupled to the device by way of input/output ports.

The configuration controller may comprise a number of registers, including a Command register 518 and a General register 520 comprising a first general register (Gen 1) and a second general register (Gen 2), the functions of which will be described in more detail below. The Command register and the General register may be loaded with data from a variety of sources, including a configuration port 522, a IEEE Joint Test Action Group (JTAG) port 524 and an Internal Configuration Access Port (ICAP) interface 526. While the device may be initially configured by the configuration port, the ICAP interface enables a configuration method that is available to the internal logic resources after the device is configured. The ICAP interface may emulate a conventional configuration protocol for the device and provide any necessary mode select values to the configuration controller. A plurality of JTAG inputs, including a test data input (TDI) pin, a test clock (TCK) pin, and test mode select (TMS) pin and a test data output (TDO) pin are coupled to a JTAG circuit 524. The JTAG circuit may be used to couple data to the memory elements 506-516 or directly to registers of the configuration controller 106 according to the IEEE JTAG Standard 1149.1, which is well known in the art. The command register and the general register may also be loaded with data by way of the inputs to the multiplexer 528. In particular, a selection signal S3 may be used to select which input port provides data to the configuration controller, while a second multiplexer 530 controlled by a selection signal S4 may be used to couple the selected input to a predetermined register. Alternatively, the data selected by the multiplexer 528 may be coupled to memory 505 or memory 511. Accordingly, the stored values of the variant select values or the mode select signals may be loaded or changed by way of the various inputs to the multiplexer 528.

The circuit of FIG. 5 enables a programmable logic device to switch between configuration modes, enabling configuration with different types of external memory. In addition to the instruction bits output by multiplexer 202, the command decoder 503 is coupled to receive the mode select signal, data stored in the general register 520, a command stored in the command register 518, and a variant select value output at the multiplexer 502. The command decoder 503 generates a command comprising a programming command which is coupled to the non-volatile memory 110, or any other selected non-volatile memory. The selected non-volatile memory may be selected based upon the programming command. For example, the device could initially be configured using an SPI serial PROM, then reboot from a specified location in a parallel NOR Flash memory. The circuit of FIG. 5 further enhances the ability to change the configuration of a programmable logic device at each boot-up, changing the functionality of the programmable logic device as required. According to various embodiments of the present invention, a user is allowed to store multiple configurations as different revisions in multiple non-volatile memory devices which may be different types of devices. That is, the different types of non-volatile memory devices may be from different manufacturers, have different sizes, operate in different modes, such as serial or parallel modes, respond to different commands, such as different read commands, or have other differences which would affect the way the configuration controller interfaces with the memory device. Note that in some embodiments, volatile memory devices, such as an SRAM, may also be used for storing configurations that can be selected at each boot-up.

Because some programmable logic devices are reprogrammable during operation, some applications reload the programmable logic device with one or more configuration bitstreams during normal operation after initial startup. According to an embodiment of the present invention, a programmable logic device may reboot using different configuration modes. For example, the programmable logic device may initially configure from a parallel Flash using a BPI mode, then multi-boot to a configuration bitstream stored in an SPI serial Flash using a Master SPI mode. While the initial configuration bitstream is typically located at address 0, regardless of configuration mode, subsequent configuration bitstreams may be located anywhere in memory, and may be aligned to a byte location. In this way, a single, smaller programmable logic device, reprogrammed multiple times, may be used to replace a much larger and more expensive ASIC or programmable logic device programmed just once.

For multi-boot operations, there are different ways for the programmable logic device to load the address of the next multi-boot configuration bitstream. For example, a fixed, known address stored in a general register may be used. That is, if the next address is predefined and known at design time, the next multi-boot address may be preloaded within the initial configuration bitstream. Alternatively, a variable or calculated address may be used, where the programmable logic device application itself supplies the address of the next multi-boot bitstream. While a parallel NOR Flash address or an SPI serial Flash address is specified as a seven-character hexadecimal string, for example, any type of address may be employed.

The multi-boot starting address and mode setting may be loaded to the internal configuration controller through other means, such as an ICAP interface. By way of example, the following steps are required to initiate a multi-boot reconfiguration event from within a programmable logic device application using an ICAP design primitive. After issuing a synchronization start word to the ICAP interface, if the application calculates the next multi-boot configuration start address, the General register 520 is loaded via ICAP interface 526 with the start address of the next multi-boot configuration bitstream. If rebooting from a different configuration source, the appropriate values for the mode are selected. A reboot command is issued to a Command register 518. The General register 520 is preloaded during configuration. The next multi-boot address may be stored in the same memory originally used to configure the device or the same memory used during the last multi-boot operation. Although the specific bit sequences supplied above relate to the ICAP interface, the same general approach also applies for the other interfaces. For example, multi-boot requests may also be issued via JTAG, a Slave Serial interface, or a Slave Parallel interface. For example, the mode select values and the variant select values may be stored in memory elements 506-516 by way of the JTAG pins after an initial configuration to enable reconfiguration of the programmable logic device according to the new mode select values and variant select values stored in memory elements 506-516.

During a multi-boot event, the configuration controller determines which configuration mode to execute. By default, the mode select values physically defined on the mode select inputs of the programmable logic device are used. For example, if the mode select inputs specify the Master SPI Flash mode, then the controller uses the variant select values, VS[2:0], defined by the associated input/output pins. However, by setting a control bit, such as a selection signal input to the multiplexer 504, indicating that a new mode is to be used in downloading a configuration bitstream, the internal configuration controller 106 uses the configuration mode specified by the output of the multiplexer 504 and, for a predetermined boot mode, the instruction specified by the variant select values. General register 520 may also be used to govern which modes and which commands may be used by the configuration controller.

Figure 6:
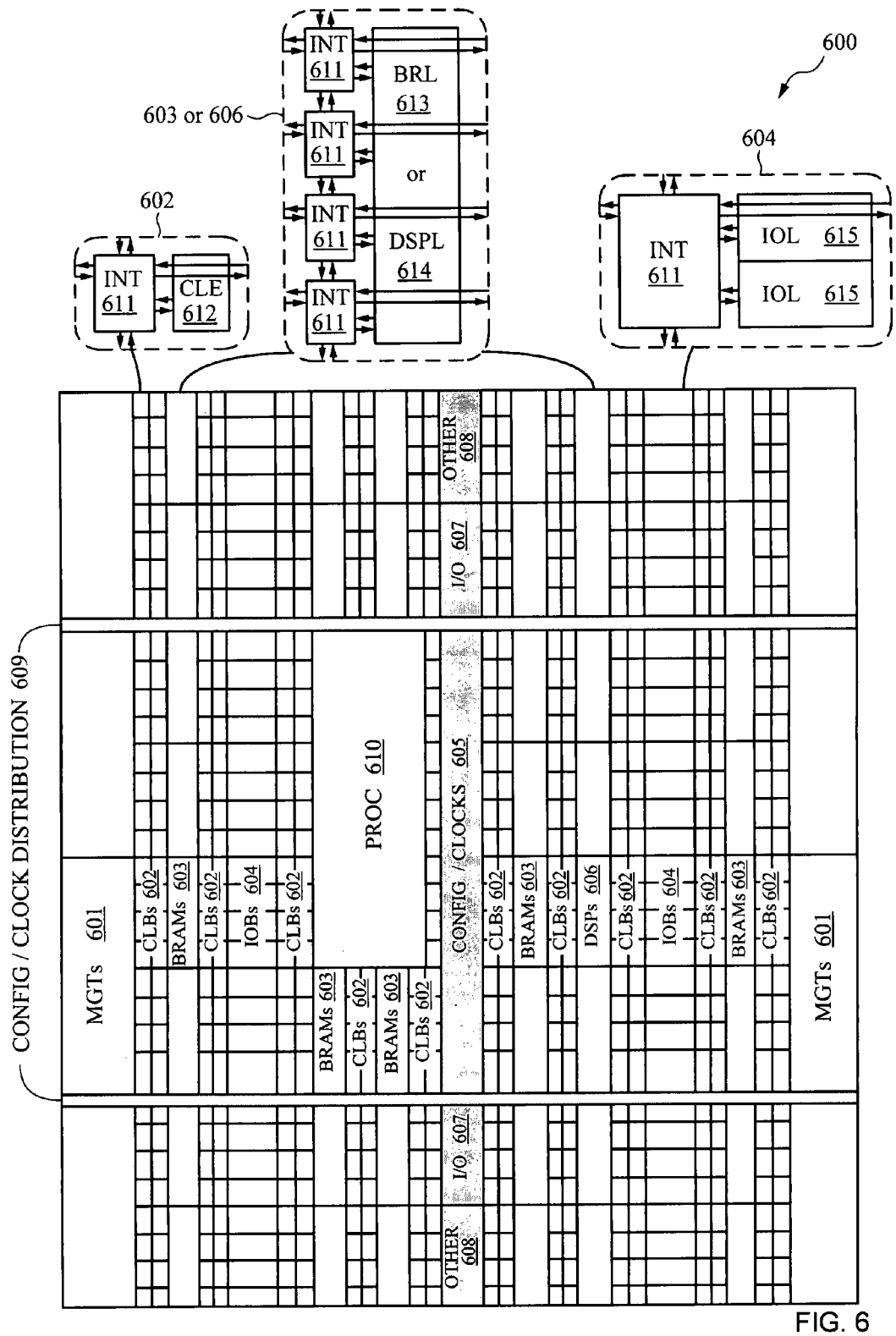
FIG. 6 is a block diagram of a programmable logic device according to an embodiment of the present invention.

Turning now to FIG. 6, a block diagram of a programmable logic device according to an embodiment of the present invention is shown. As noted above, advanced FPGAs may include several different types of programmable logic blocks in the array. For example, FIG. 6 illustrates an FPGA architecture that includes a large number of different programmable tiles comprising programmable logic including multigigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 may include a configurable logic element (CLE 612) that may be programmed to implement user logic plus a single programmable interconnect element (INT 611). A BRAM 603 may include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) may also be used. A DSP tile 606 may include a DSP logic element (DSPL 614) in addition to an appropriate number of programmable interconnect elements. An IOB 604 may include, for example, two instances of an input/output logic element (IOL 615) in addition to one instance of the programmable interconnect element (INT 611). As will be clear to those of skill in the art, the actual I/O pads connected, for example, to the I/O logic element 615 typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks may be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 7:
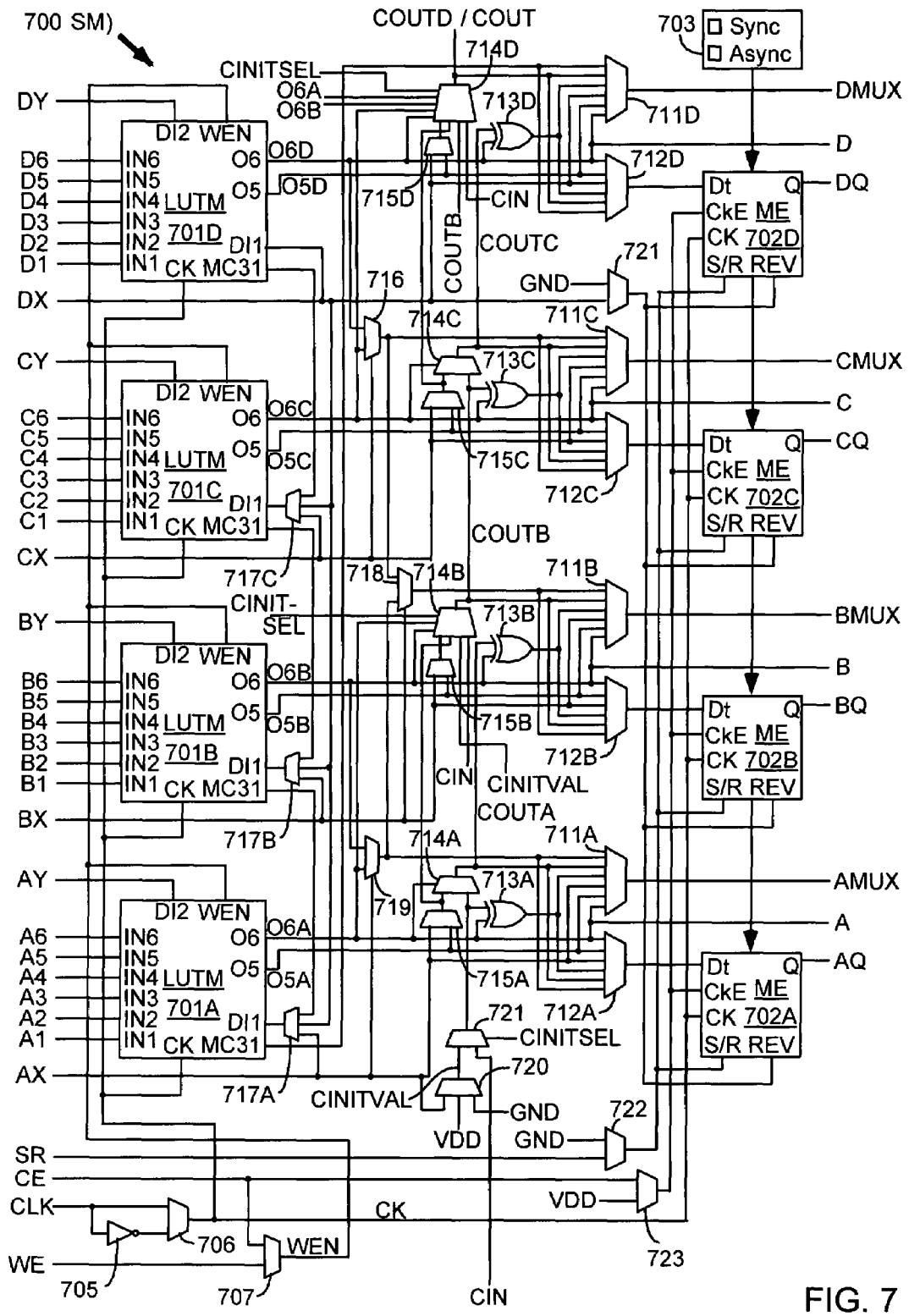
FIG. 7 is a block diagram of a configurable logic element of the programmable logic device of FIG. 6 according to an embodiment of the present invention.

Turning now to FIG. 7, a block diagram of a configurable logic element of the programmable logic device of FIG. 6 according to an embodiment of the present invention is shown. In particular, FIG. 7 illustrates in simplified form a configurable logic element of a configuration logic block 602 of FIG. 6. In the embodiment of FIG. 7, slice M 700 includes four lookup tables (LUTMs) 701A-701D, each driven by six LUT data input terminals A1-A6, B1-B6, C1-C6, and D1-D6 and each providing two LUT output signals O5 and O6. The O6 output terminals from LUTs 701A-701D drive slice output terminals A-D, respectively. The LUT data input signals are supplied by the FPGA interconnect structure via input multiplexers, which may be implemented by programmable interconnect element 611, and the LUT output signals are also supplied to the interconnect structure. Slice M also includes: output select multiplexers 711A-711D driving output terminals AMUX-DMUX; multiplexers 712A-712D driving the data input terminals of memory elements 702A-702D; combinational multiplexers 716, 718, and 719; bounce multiplexer circuits 722-723; a circuit represented by inverter 705 and multiplexer 706 (which together provide an optional inversion on the input clock path); and carry logic comprising multiplexers 714A-714D, 715A-715D, 720-721 and exclusive OR gates 713A-713D. All of these elements are coupled together as shown in FIG. 7. Where select inputs are not shown for the multiplexers illustrated in FIG. 7, the select inputs are controlled by configuration memory cells. That is, configuration bits of the configuration bitstream stored in the configuration memory cells are coupled to the select inputs of the multiplexer to select the correct input to the multiplexer. These configuration memory cells, which are well known, are omitted from FIG. 7 for clarity, as well as from other selected figures herein.

In the pictured embodiment, each memory element 702A-702D may be programmed to function as a synchronous or asynchronous flip-flop or latch. The selection between synchronous and asynchronous functionality is made for all four memory elements in a slice by programming Sync/Asynch selection circuit 503. When a memory element is programmed so that the S/R (set/reset) input signal provides a set function, the REV input terminal provides the reset function. When the memory element is programmed so that the S/R input signal provides a reset function, the REV input terminal provides the set function. Memory elements 702A-702D are clocked by a clock signal CK, which may be provided by a global clock network or by the interconnect structure, for example. Such programmable memory elements are well known in the art of FPGA design. Each memory element 702A-702D provides a registered output signal AQ-DQ to the interconnect structure. Because each LUT 701A-701D provides two output signals, I5 and O6, the LUT may be configured to function as two 5-input LUTs with five shared input signals (IN1-IN5), or as one 6-input LUT having input signals IN1-IN6.

In the embodiment of FIG. 7, each LUTM 701A-701D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 717A-717C for LUTs 701A-701C), or to the two 32-bit RAMs via input terminals DI1 and DI2. RAM write operations in the LUT RAMs are controlled by clock signal CK from multiplexer 706 and by write enable signal WEN from multiplexer 707, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 701A may also be provided to the general interconnect structure for shift register chaining, via output select multiplexer 711D and CLE output terminal DMUX. The devices having programmable logic and methods of the present invention may be implemented according to the device of FIGS. 6 and 7, or in any device, including any type of integrated circuit having programmable logic.

Figure 8:
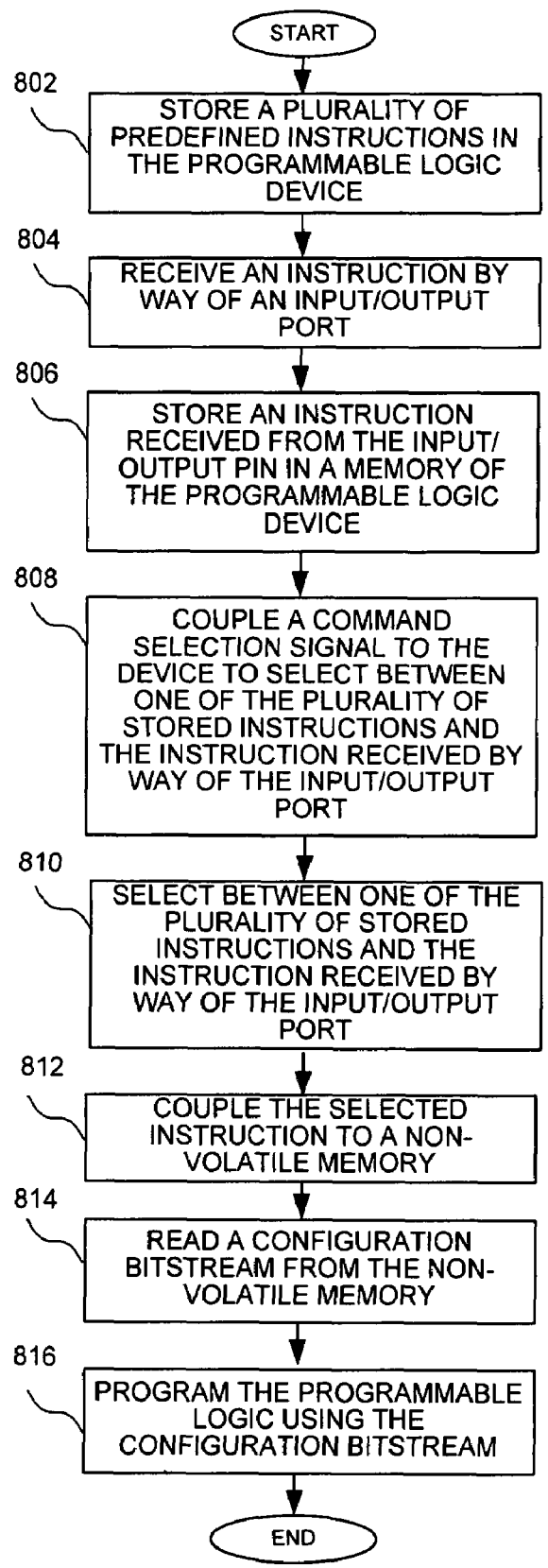
FIG. 8 is a flow chart showing a method of configuring a device having programmable logic according to an embodiment of the present invention.

Turning now to FIG. 8, a flow chart shows a method of configuring a device having programmable logic according to an embodiment of the present invention. In particular, a plurality of pre-defined instructions is stored in the device at a step 802. An instruction is received by way of at least one input/output port at a step 804. The instruction received from the input/output pin is stored in a memory of the programmable logic device at a step 806. If the instruction is received serially, as shown for example in FIG. 3, the instruction may be received by a shift register, for example. A command selection signal is coupled to the device to select between one of the plurality of stored instructions and the instruction received by way of the input/output port at a step 808. A selection is made between one of the plurality of stored instructions and the instruction received by way of the input/output port at a step 810. The selected instruction is coupled to a non-volatile memory at a step 812. A configuration bitstream is read from the non-volatile memory at a step 814. Finally, the programmable logic is programmed using the configuration bitstream at a step 816.

Figure 9:
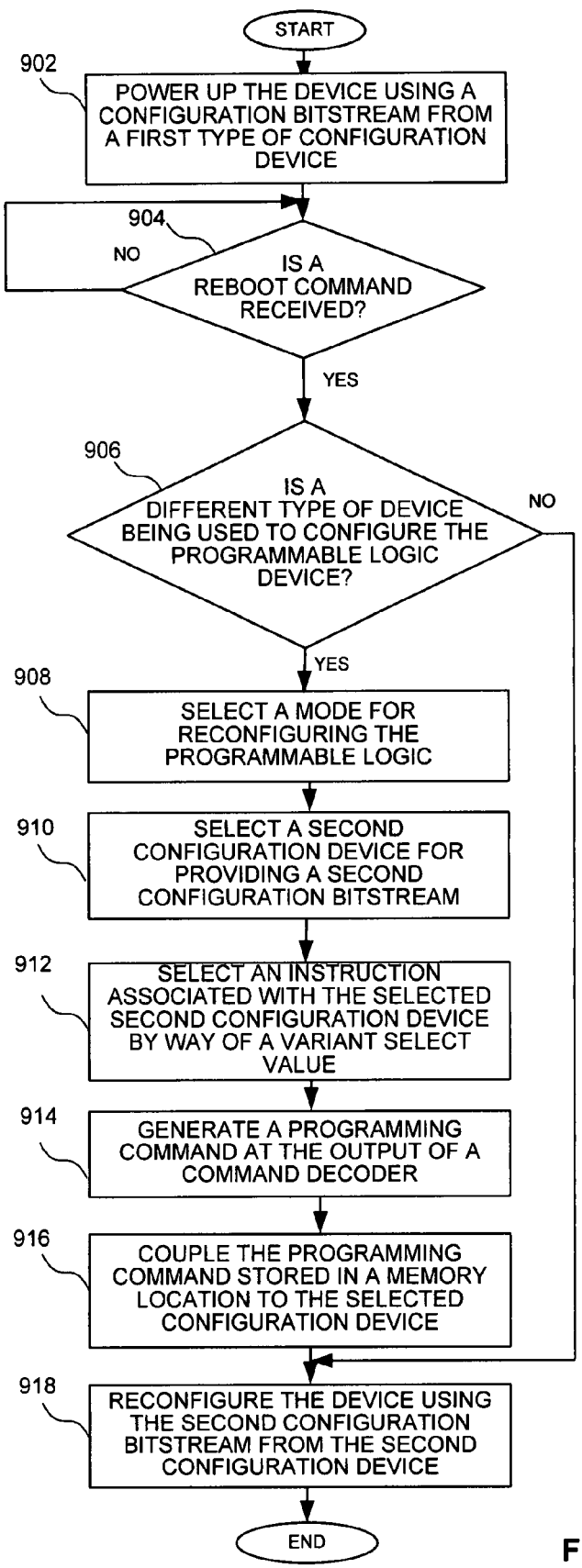
FIG. 9 is a flow chart showing a method of enabling a multi-boot configuration of a device having programmable logic according to an embodiment the present invention.

Turning now to FIG. 9, a flow chart shows a method of enabling a multi-boot configuration of a device having programmable logic according to an embodiment the present invention. In particular, a device is powered-up using a configuration bitstream from a first type of configuration device at a step 902. It is then determined whether a reboot command is received at a step 904. It is also determined whether a different type of configuration device is being used to configure the programmable logic device at a step 906. A mode is selected for reconfiguring the programmable logic at a step 908. A second configuration device is selected for providing a second configuration bitstream at a step 910. An instruction associated with the selected second configuration device is selected by way of a variant select signal at a step 912. A programming command at the output of a command decoder is generated at a step 914. The selected programming command is coupled to the selected second configuration device at a step 916. The device is then reconfigured using the second configuration bitstream from the second configuration device at a step 918. The methods of FIGS. 8 and 9 may be implemented using any of the circuits 1-7 as described, or any other suitable circuits.

It can therefore be appreciated that the new and novel device having programmable logic and method of configuring a device having programmable logic has been described. It will be appreciated by those skilled in the art that numerous alternatives and equivalents will be seen to exist which incorporate the disclosed invention. As a result, the invention is not to be limited by the foregoing embodiments, but only by the following claims.

I claim:

1. A method of configuring a device having programmable blocks, the method comprising:

storing a plurality of instructions in the device, wherein each instruction of the plurality of instructions is associated with one of a plurality of non-volatile memories, and each instruction comprises data enabling reading a configuration bitstream from the associated non-volatile memory;

selecting between one of the plurality of instructions stored in the device and an instruction coupled to an input/output port of the device;

coupling the selected instruction to a command decoder; and reading a configuration bitstream from a non-volatile memory based upon the selected instruction.

2. The method of claim 1 wherein selecting between one of the plurality of instructions stored in the device and an instruction coupled to an input/output port comprises selecting one of a plurality of inputs to a multiplexer.

3. The method of claim 2 further comprising coupling a selection signal to the multiplexer by way of input/output ports of the device.

4. The method of claim 1 wherein selecting between one of the plurality of instructions stored in the device and an instruction coupled to an input/output port comprises selecting an instruction coupled to the device by way of a plurality of input/output ports of the device.

5. The method of claim 1 wherein selecting between one of the plurality of instructions stored in the device and an instruction coupled to an input/output port of the device having programmable blocks comprises selecting an instruction received serially by way of a second input/output port of the device.

6. The method of claim 1 wherein coupling the selected instruction to a command decoder comprises coupling an instruction to generate a serial peripheral interface signal to the non-volatile memory.

7. The method of claim 1 wherein reading a configuration bitstream from the non-volatile memory comprises reading from a non-volatile memory of a plurality of different types of non-volatile memories.

8. A method of configuring a device having programmable blocks, the method comprising:
    storing a plurality of instructions in the device, wherein each instruction of the plurality of instructions is associated with one of a plurality of non-volatile memories, and each instruction comprises data enabling reading a configuration bitstream from the associated non-volatile memory;
    receiving an instruction serially by way of an input/output port;
    storing the instruction received from the input/output port in a memory of the device;
    selecting between one of the plurality of stored instructions and the instruction received by way of the input/output port; and
    coupling the selected instruction to a command decoder.

9. The method of claim 8 wherein storing a plurality of instructions comprises storing a plurality of instructions in shift registers.

10. The method of claim 8 wherein storing the instruction received from the input/output port in a memory comprises storing the instruction in a shift register.

11. The method of claim 8 wherein coupling the instruction to a command decoder comprises enabling generating a programming command for a non-volatile memory of a plurality of different types of non-volatile memories.

12. The method of claim 8 further comprising coupling a selection signal to the device to select between one of the plurality of stored instructions and the instruction received by way of the input/output port.

13. The method of claim 8 further comprising reading a configuration bitstream from a non-volatile memory based upon the selected instruction.

14. The method of claim 13 further comprising programming the programmable blocks of the device using the configuration bitstream.

15. A device having programmable blocks, the device comprising:
    a plurality of memory locations storing a plurality of instructions, wherein each instruction of the plurality of instructions is associated with one of a plurality of non-volatile memories, and each instruction comprises data enabling reading a configuration bitstream from the associated non-volatile memory;
    an input/output port coupled to receive an instruction;
    a configuration controller comprising a selection circuit coupled to the plurality of memory locations and the input/output port, the selection circuit selecting an instruction from one of the plurality of memory locations or the instruction received at the input/output port; and
    a plurality of programmable blocks coupled to receive configuration bits of a configuration bitstream received based upon the selected instruction.

16. The device of claim 15 wherein the selection circuit comprises a multiplexer.

17. The device of claim 16 further comprising a selection signal coupled to the multiplexer to select an instruction from one of the plurality of memory locations or the instruction received at the input/output port.

18. The device of claim 15 wherein the input/output port comprises a plurality of input/output pins.

19. The device of claim 15 further comprising a memory location coupled to the input/output port.

20. The device of claim 19 wherein the plurality of memory locations and the memory location coupled to the input/output port comprise a plurality of shift registers.

21. A method of enabling a multi-boot configuration of a device having programmable blocks, the method comprising:
    powering up the device using a first configuration bitstream from a first configuration device comprising a first type of device in response to a first command;
    receiving a reboot command; and
    reconfiguring the device using a second configuration bitstream from a second configuration device comprising a second type of device in response to a second command which is different than the first command.

22. The method of claim 21 further comprising selecting a mode for receiving the first configuration bitstream from the first configuration device.

23. The method of claim 22 further comprising selecting a mode for receiving the second configuration bitstream from the second configuration device.

24. The method of claim 23 wherein selecting a mode for receiving the second configuration bitstream comprises using a mode setting from the first configuration bitstream.

25. The method of claim 21 further comprising loading a starting address and mode setting for loading the second configuration bitstream to a configuration controller of the device.

26. The method of claim 21 further comprising coupling a programming command to the second configuration device based upon data stored in a memory of the device.

27. The method of claim 21 further comprising coupling a programming command to the second configuration device based upon data received by way of an input/output port.

28. A method of enabling a multi-boot configuration of a device having programmable blocks, the method comprising:
    powering up the device using a configuration bitstream from a first configuration device comprising a first type of device;
    receiving a reboot command;
    selecting a mode for reconfiguring the programmable blocks in response to a mode select value;
    selecting a second configuration device comprising a second type of device for providing a second configuration bitstream; and reconfiguring the programmable blocks using the second configuration bitstream from the second configuration device.

29. The method of claim 28 wherein receiving a reboot command comprises coupling a reboot command to an internal configuration controller.

30. The method of claim 28 wherein selecting a mode for reconfiguring the programmable blocks comprises one of selecting a mode stored in a memory of the device or selecting a mode by way of an input/output port.

31. The method of claim 28 further comprising coupling a programming command to the second configuration device.

32. The method of claim 28 further comprising coupling a programming command to a selected second configuration device by way of an input/output port of the device.

33. The method of claim 32 wherein coupling a programming command to a selected configuration device by way of an input/output port comprises generating a programming command based upon a value stored in a memory of the device.

34. The method of claim 32 wherein coupling a programming command to a selected second configuration device by way of an input/output port comprises generating a programming command based upon a value received by way of an input/output port.

35. A circuit enabling a multi-boot configuration of a device having programmable blocks, the circuit comprising:

a programmable circuit configured according to a first configuration bitstream stored in a first configuration device comprising a first type of device;
a selection circuit coupled to receive a selection signal; and
a command decoder coupled to receive the output of the selection circuit, a command controller generating a programming command for the configuration device, wherein the programming command enables reconfiguring the programmable circuit according to a second configuration bitstream from a second configuration device of a second type of device which is different than the first type of device.

36. The circuit of claim 35 wherein the selection circuit comprises a selection circuit from the group consisting of a selection circuit for selecting a mode select value, a selection signal for selecting a variant select value, and a selection circuit for selecting an instruction for the command decoder.

37. The circuit of claim 35 wherein the selection circuit selects between data stored in a memory of the device and data received by way of an input/output port of the device.

38. The circuit of claim 37 further comprising an input/output port for receiving a mode select value.

39. The circuit of claim 37 further comprising an input/output port for receiving the variant select value.

40. The circuit of claim 37 further comprising a plurality of configuration ports for loading the memory.

* * * * *